US011688638B2

(12) United States Patent
Chan et al.

(10) Patent No.: US 11,688,638 B2
(45) Date of Patent: Jun. 27, 2023

(54) PRODUCTION OF VERY SMALL OR THIN DIES (71) Applicant: SRI International, Menlo Park, CA (US)

(72) Inventors: Winston K. Chan, Princeton, NJ (US); Joey J. Michalchuk, Lambertville, NJ (US)

(73) Assignee: SRI International, Menlo Park, CA (US)

( * ) Notice: Subject to any disclaimer, the term of this patent is extended or adjusted under 35 U.S.C. 154(b) by 667 days.

(21) Appl. No.: 16/497,113

(22) PCT Filed: Mar. 27, 2018

(86) PCT No.: PCT/US2018/024541
§ 371 (c)(1),
(2) Date: Sep. 24, 2019

(87) PCT Pub. No.: WO2018/183309
PCT Pub. Date: Oct. 4, 2018

(65) Prior Publication Data
US 2021/0125867 A1  Apr. 29, 2021

Related U.S. Application Data (60) Provisional application No. 62/477,907, filed on Mar. 28, 2017.

(51) Int. Cl.
H01L 21/683 (2006.01)
H01L 21/78 (2006.01)
(Continued)

(52) U.S. Cl.
CPC ............ H01L 21/78 (2013.01); B32B 43/006 (2013.01); C09J 9/02 (2013.01); C09J 11/04 (2013.01);
(Continued)

(58) Field of Classification Search
CPC ............... H01L 21/67092; H01L 21/78; H01L 2221/68381
See application file for complete search history.

(56) References Cited

U.S. PATENT DOCUMENTS 4,606,962 A    8/1986  Reylek et al.
6,771,613 B1   8/2004  O'Toole et al.
(Continued)

FOREIGN PATENT DOCUMENTS

JP    5-343492 A     12/1993
JP    2016054252 A   4/2016

OTHER PUBLICATIONS

International Search Report and Written Opinion, PCT/US2018/024541, ISA:US, dated May 25, 2018, 10 pp.
(Continued)

Primary Examiner — Dale E Page
Assistant Examiner — Wilner Jean Baptiste
(74) Attorney, Agent, or Firm — Rutan and Tucker, LLP (57) ABSTRACT A system to manufacture a plurality of dies may include an etching tool, an electrically-conductive-adhesive-composition, a heat-applying-extraction-tool and a porous substrate cooperating with an evacuation component. The etching tool uses an ion beam that is configured to singulate a plurality of dies on a wafer with an ion etching process. The electrically-conductive-adhesive-composition is located between the wafer and a porous substrate carrying the wafer during the ion etching process. The electrically-conductive-adhesive-composition adheres the wafer to the porous substrate to keep the dies in place during the ion etching process. The electrically-conductive-adhesive-composition also aids in conducting electrons away from the wafer as a drain during the ion etching process. The heat-applying-extraction-tool applies heat to an individual die during a handling process of the manufacturing process in order to melt the electri-
(Continued)

cally-conductive-adhesive-composition through the porous substrate to an evacuation component in order to then pick up an individual die singulated from the wafer.

20 Claims, 7 Drawing Sheets

(51) Int. Cl.

| | | |
|---|---|---|
| *B32B 43/00* | (2006.01) | |
| *C09J 9/02* | (2006.01) | |
| *C09J 11/04* | (2006.01) | |
| *C09J 191/06* | (2006.01) | |
| *H01L 21/67* | (2006.01) | |
| *H01L 29/06* | (2006.01) | |
| *C08K 3/08* | (2006.01) | |

(52) U.S. Cl.
CPC ...... *C09J 191/06* (2013.01); *H01L 21/67092* (2013.01); *H01L 21/6835* (2013.01); *H01L 29/0657* (2013.01); *C08K 2003/085* (2013.01); *C08K 2003/0806* (2013.01); *C08K 2003/0831* (2013.01); *C08K 2201/001* (2013.01); *H01L 2221/68327* (2013.01); *H01L 2221/68381* (2013.01)

(56) References Cited

U.S. PATENT DOCUMENTS

| | | | |
|---|---|---|---|
| 8,758,553 | B2 | 6/2014 | Riege et al. |
| 9,418,895 | B1 | 8/2016 | Andry et al. |
| 9,559,004 | B2 | 1/2017 | Han et al. |
| 10,824,042 | B1* | 11/2020 | Amundson ............. G02F 1/167 |
| 10,964,576 | B2* | 3/2021 | Yamamoto ........ H01L 21/67092 |
| 2005/0156318 | A1 | 7/2005 | Douglas |
| 2010/0047564 | A1 | 2/2010 | Kim et al. |
| 2010/0315153 | A1 | 12/2010 | Oksanen et al. |
| 2011/0162526 | A1* | 7/2011 | Tatsumi ................... B03C 3/08 47/20.1 |
| 2013/0232587 | A1 | 9/2013 | Boday et al. |
| 2014/0042627 | A1 | 2/2014 | Edelstein et al. |
| 2015/0138686 | A1* | 5/2015 | Adderly ............. H01L 21/6833 361/234 |
| 2018/0276420 | A1 | 9/2018 | Kane |

OTHER PUBLICATIONS

Michael Raj Marks et al. "Ultrathin wafer pre-assembly and assembly process technologies: A review." Critical Reviews in Solid State and Materials Sciences. 2015, vol. 40, No. 5, figure 2; p. 252, paragraphs 1, 3: p. 253, paragraph 1; p. 280, paragraphs 2-3.

* cited by examiner

Carbon loaded wax sidewall

Fig. 7A

PRODUCTION OF VERY SMALL OR THIN DIES

CROSS-REFERENCE

This application claims priority under 35 USC 119 to U.S. provisional patent application Ser. 62/477,907, titled "Production of very small or thin dies," filed Mar. 28, 2017, the disclosure of which is incorporated herein by reference in its entirety.

GOVERNMENT RIGHTS

This invention was made with government support under contract number HR0011-15-C-0010 awarded by the Defense Advanced Research Projects Agency (DARPA). The government has certain rights in the invention.

TECHNICAL FIELD

Embodiments of this disclosure relate generally to dies and integrated circuits.

SUMMARY

Provided herein can be various methods, apparatuses, and systems for dies and integrated circuits.

In an embodiment, a system to manufacture a plurality of dies may include an etching tool, an electrically-conductive-adhesive-composition, a heat-applying-extraction-tool, and a porous substrate cooperating with an evacuation component. The etching tool uses an ion beam that is configured to singulate a plurality of dies on a wafer with an ion etching process. The electrically-conductive-adhesive-composition is located between the wafer and a porous substrate carrying the wafer during the ion etching process. The electrically-conductive-adhesive-composition adheres the wafer to the porous substrate to keep the dies in place during the ion etching process. The electrically-conductive-adhesive-composition also aids in at least one of conducting electrons away from the wafer as a drain or conducting electrons into the wafer as a source of electrons during the ion etching process. The heat-applying-extraction-tool applies heat to an individual die during a handling process of the manufacturing process, which is after the etching process. The heat-applying-extraction-tool is configured to apply heat to melt the electrically-conductive-adhesive-composition through the porous substrate to an evacuation component in order to then pick up an individual die singulated from the wafer.

While the design is subject to various modifications, equivalents, and alternative forms, specific embodiments thereof have been shown by way of example in the drawings and will now be described in detail. It should be understood that the design is not limited to the particular embodiments disclosed, but—on the contrary—the intention is to cover all modifications, equivalents, and alternative forms using the specific embodiments.

DESCRIPTION

In the following description, numerous specific details can be set forth, such as examples of specific data signals, named components, number of frames, etc., in order to provide a thorough understanding of the present design. It will be apparent, however, to one of ordinary skill in the art that the present design can be practiced without these specific details. In other instances, well known components or methods have not been described in detail but rather in a block diagram in order to avoid unnecessarily obscuring the present design. Further, specific numeric references such as the first die, can be made. However, the specific numeric reference should not be interpreted as a literal sequential order but rather interpreted that the first die is different than a second die. Thus, the specific details set forth can be merely exemplary. The specific details can be varied from and still be contemplated to be within the spirit and scope of the present design. The term "coupled" is defined as meaning connected either directly to the component or indirectly to the component through another component.

An electrically-conductive-adhesive-composition can be located between the wafer and the (porous or non-porous) substrate carrying the wafer during the ion etching process. The electrically-conductive-adhesive-composition adheres the wafer to the substrate to keep the dies in place during the ion etching process. The electrically-conductive-adhesive-composition also aids in conducting electrons away from the wafer as a drain during the ion etching process. During a handling process of the manufacturing process, a heat-applying-extraction-tool may apply heat to an individual die in order to melt the adhesive material, such as the electrically-conductive-adhesive-composition, through the porous substrate to an evacuation component in order to then pick up an individual die singulated from the wafer.

A die production process may involve etching a silicon wafer, dicing the wafer to produce the dies, programming and testing of the dies, singulation of the dies, release, pick up and placement of the dies, and packaging of the dies.

Etching Process

In the production of thin silicon wafers, one step prior to etching or dicing is to mount the wafer on a carrier utilizing an adhesive. This step may be followed by reactive ion etching to achieve the dicing.

Figure 1:
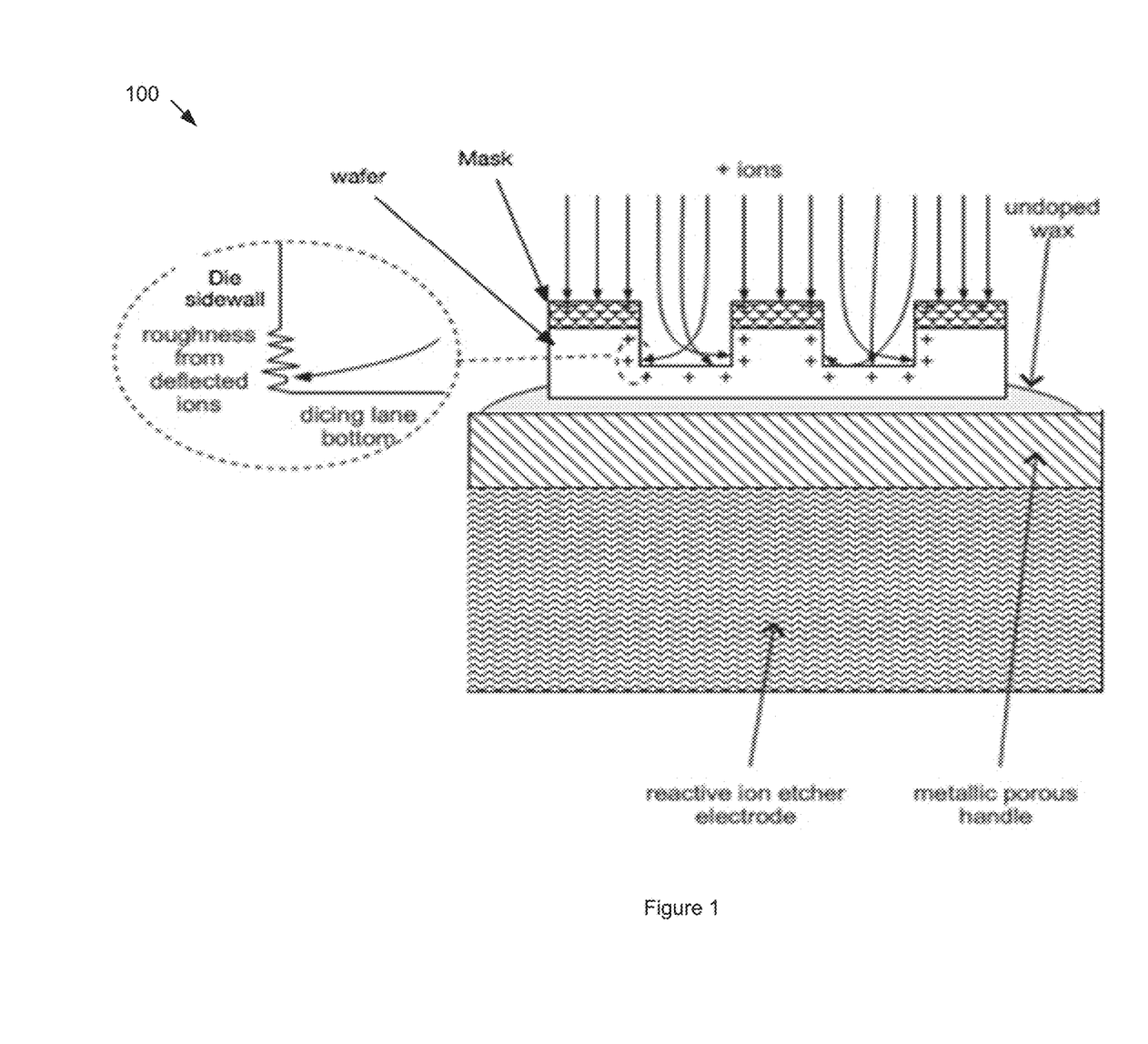
FIG. 1 is a simplified schematic diagram illustrating use of a reactive ion etching technique in the production of a very small or thin silicon wafer.

FIG. 1 illustrates use of reactive ion etching and resulting roughness in the sidewall. FIG. 1 shows a mask on the wafer and then ion beams from reflective ion etching tool coming down on to the wafer cutting through the wafer to create individual dies in the margin areas between dies. A non-conductive adhesive holds the dies in the wafer to the electrode of the reflective ion etching tool. FIG. 1 shows the utilization of ions to dice and etch the wafer in the non-masked regions. However, as can be seen in the inset that shows a magnified view of one of the corners of the wafer, the ion etching process results in roughness of the sidewalls. The ion etching process results in rough surface morphology of the sidewalls typically near the bottom of dicing lanes. Thus, prior attempts would create rough edges on the sidewall of the die on the individual dies that were cut. These rough edges caused in the sidewall of the die form defects in that die and allow for impurities to penetrate into the rough edges of the die. These impurities caused the die to degrade over time; and thus, cause defects in the die. This roughness can also make the silicon less reliable, for example, by being more susceptible to undesirable chemical reactions or by being more likely to fracture.

Figure 2:
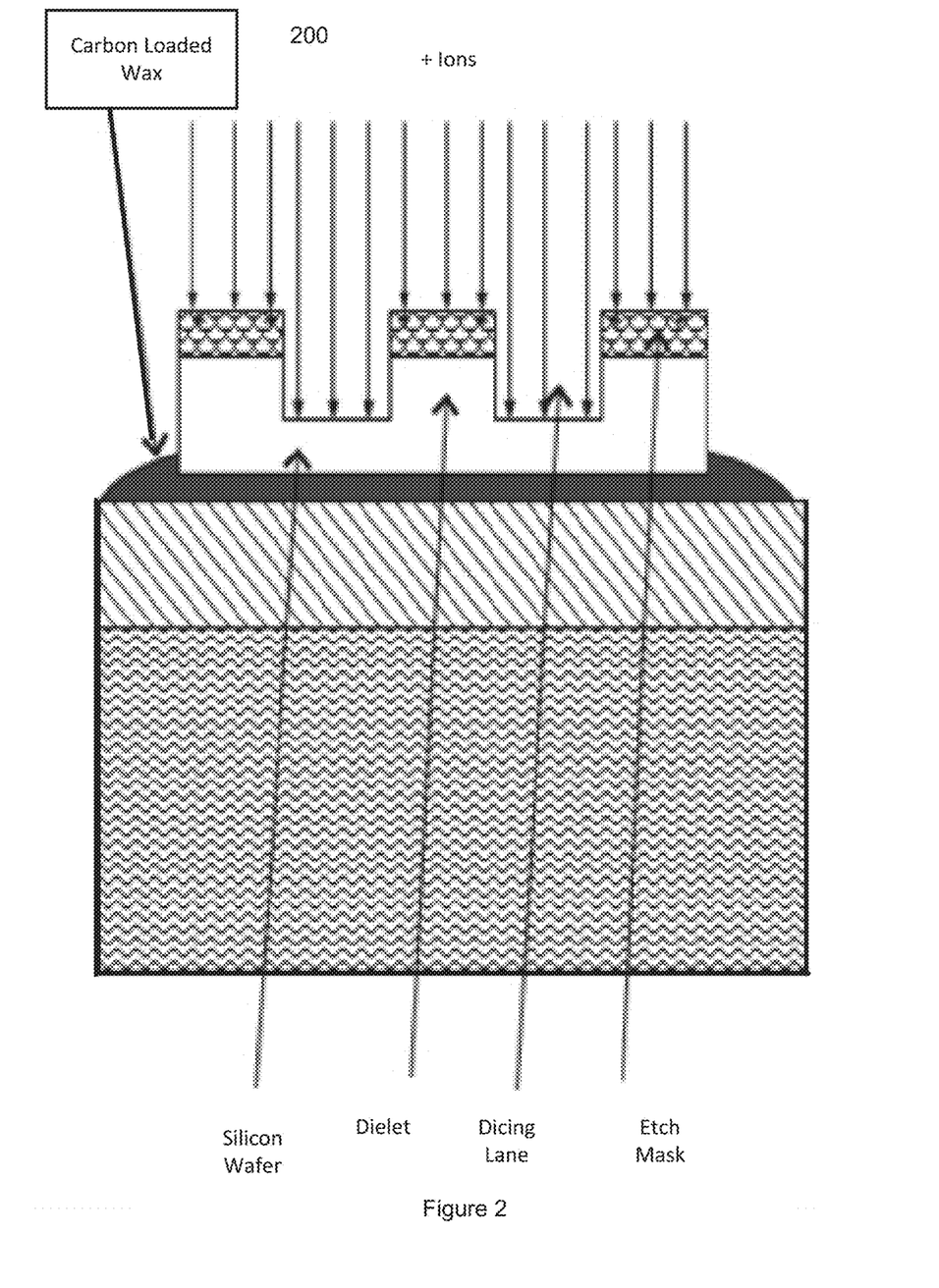
FIG. 2 is a simplified schematic diagram illustrating a technique to reduce roughness in a sidewall of a silicon wafer, which may result from the reactive ion etching process.

FIG. 2 illustrates a simplified schematic diagram of an embodiment of a technique to reduce roughness in a sidewall of a silicon wafer, which may result from the reactive ion etching process.

An electrically-conductive-adhesive-composition may be used between the wafer and the porous substrate carrying the wafer during the ion etching process to achieve smoother side walls. The electrically-conductive-adhesive-composition adheres the wafer to the porous substrate to keep the dies in place during the ion etching process. The electrically-conductive-adhesive-composition also aids in conducting electrons away from the wafer as a drain during the ion etching process. The electrically-conductive-adhesive-composition results in a strong surface adhesion during wafer dicing/singulation as described herein, and intentionally induced reduced adhesion during subsequent processes such as the pick-and-placement process as described herein.

In an embodiment, the electrically-conductive-adhesive-composition may be a composition of wax loaded with carbon particles and the porous substrate material may be a sintered stainless steel filter.

A wafer is placed on the porous substrate utilizing the wax loaded with carbon particles. The wax itself has adhesive properties such that it keeps the wafer in place during processes such as dicing. The space between individual dies is being etched away. However, the technique uses an electrically-conductive-adhesive-composition to prevent an ion buildup and drain electrons so that straight edges are formed from ion etching that forms the sidewalls of the die. One hypothesis that has been developed by the inventors explaining the roughness of FIG. 1 is that electrical charge accumulates in the silicon during reactive ion etching due to implantation of some of the reactive ions or due to the emission of secondary ions or due to other processes. Normally, this charge is neutralized by electrons flowing from the electrode that the silicon is placed on if the charge is positive or by excess electrons flowing to the electrode if the accumulated charge is negative. In either case, a potential presence of non-conductive wax or other non-conductive layer prevents the neutralization of the accumulated charge. Since the silicon is conductive, the unneutralized accumulated charge distributes over the silicon surface and deflects the incident reactive ions into the sidewalls of the dicing lane where they etch the silicon. The electrically-conductive-adhesive-composition is utilized to direct ions in the ion beams to keep coming down straight and not be deflected by a buildup in the silicon.

Figure 7A:
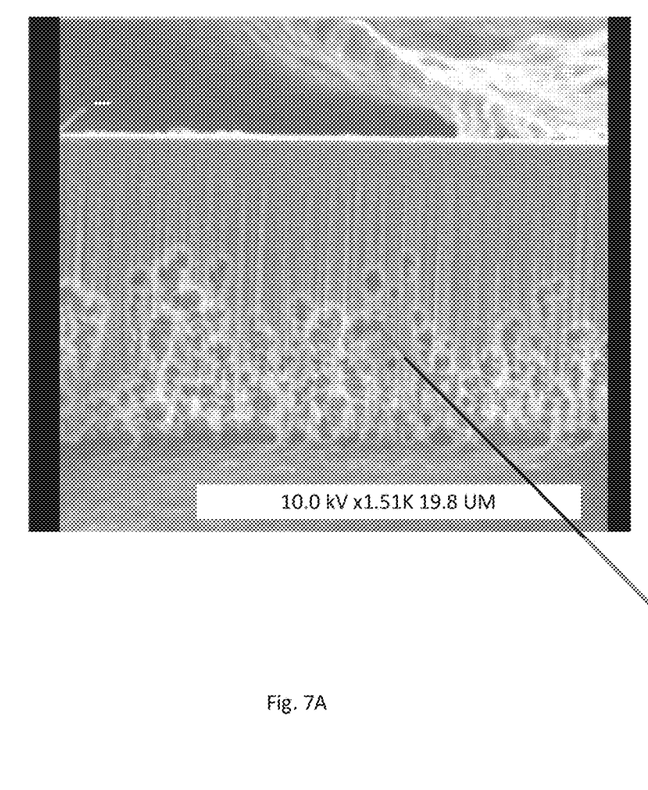
FIGS. 7A and 7B illustrate scanning electron micrographs of silicon chips with dimensions of the example sizes of some dies discussed herein.
Figure 7B:
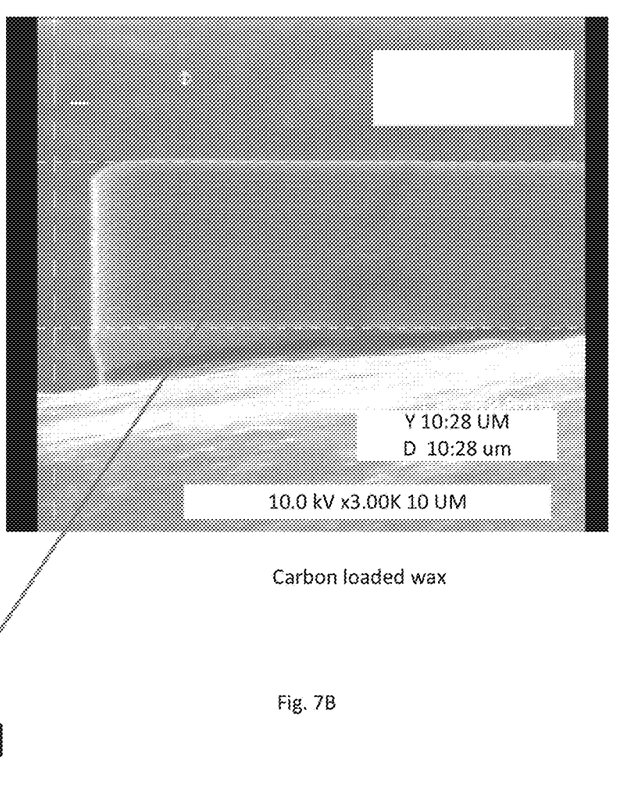

Again, the process in FIG. 2 uses an electrically-conductive-adhesive-composition, such as a carbon loaded wax or other polymers, to conduct electrons as a drain in order to make straight edges on very small dies and decrease sidewall roughness that may be introduced by the etching process. In this technique, the electrically conductive material may be, but is not limited to: i) carbon particles, ii) silver particles, iii) copper particles, iv) gold particles, or iv) a combination of these two or three, loaded within the wax. The adhesive material may be but is not limited to wax, such as bee's wax or Crystalbond 509. The electrically-conductive-adhesive-composition may be the wax loaded with this electrically conductive material. When such conductive material is added to the wax, electrons can flow to or from the reactive ion etcher electrode through the porous metallic carrier/substrate, the conductive wax, and the conductive silicon in order to neutralize the silicon. With the introduction of the electrically-conductive-adhesive-composition, the roughness of the sidewalls of the wafer should be decreased or eliminated. The carbon loaded wax drains the electrons to dissipate any buildup of ions that would cause the rough surfaces in the sidewalls of the individual dies being etched out on the wafer. The electrically conductive wax allows the process to get straight cuts with the ion etching tool (See FIG. 7B for example). No electric charge builds up to deflect the ions coming down etching through the wafer. The resulting side walls are very smooth compared to previous techniques.

The electrically-conductive-adhesive-composition performs two functions. The first function of holding the wafer down in contact with the ion etching tool. The second function being a good electricity conductor; and thus, conducting and preventing of the electric charge from building up during the etching process.

Various compositions of the conductive material and wax mixture may be utilized. For example with carbon, in one composition, a 3% by weight carbon black is mixed with bee's wax. In another composition, a 3% by weight carbon black is mixed with Crystalbond 509. In these example compositions, the carbon black is conductive and its concentration in the waxes is above the percolation limit to ensure that the carbon forms a continuous conductive path through the wax and not just conductive islands that are isolated by nonconductive wax. However, adding too much carbon can change other desirable properties of the wax such as its melting temperature and its tackiness.

As discussed, the electrically-conductive-adhesive-composition includes a mixture of an amount of conductive material and an amount of adhesive material. The amount of conductive material in the mixture is generally an amount that is greater than a percolation limit and less than an amount that causes a change to a physical property of the adhesive material of the mixture. Examples of physical properties of the adhesive material include but are not limited to melting temperature, a change in viscosity such that the composition becomes too viscous to release the die, and tackiness. A discernable change to the physical properties of the adhesive material could be change of a melting temperature of the adhesive material itself by more than five degrees C. Thus, in this example, enough carbon particles could be loaded into the electrically-conductive-adhesive-composition to achieve a desired amount of electrical conduction but not change of the melting temperature of the wax by more than 5 degrees C.

Again, the process for dicing a wafer using reactive ion etching typically involves mounting the wafer on a carrier using an adhesive (e.g., wax). The wafer dry-etch dicing and subsequent pick and place operation in packaging the resulting chips place stringent demands on the mounting adhesive, especially for very small or thin wafers. The disclosed approach enables a wider selection of adhesives from which to choose, as the choice can be made with little or no consideration for the conductivity properties of the adhesive by itself. In addition, the process of adding the conductive material may be controlled such that the thermal and chemical properties of the adhesive exhibit little or no degradation.

Singulation

Figure 4:
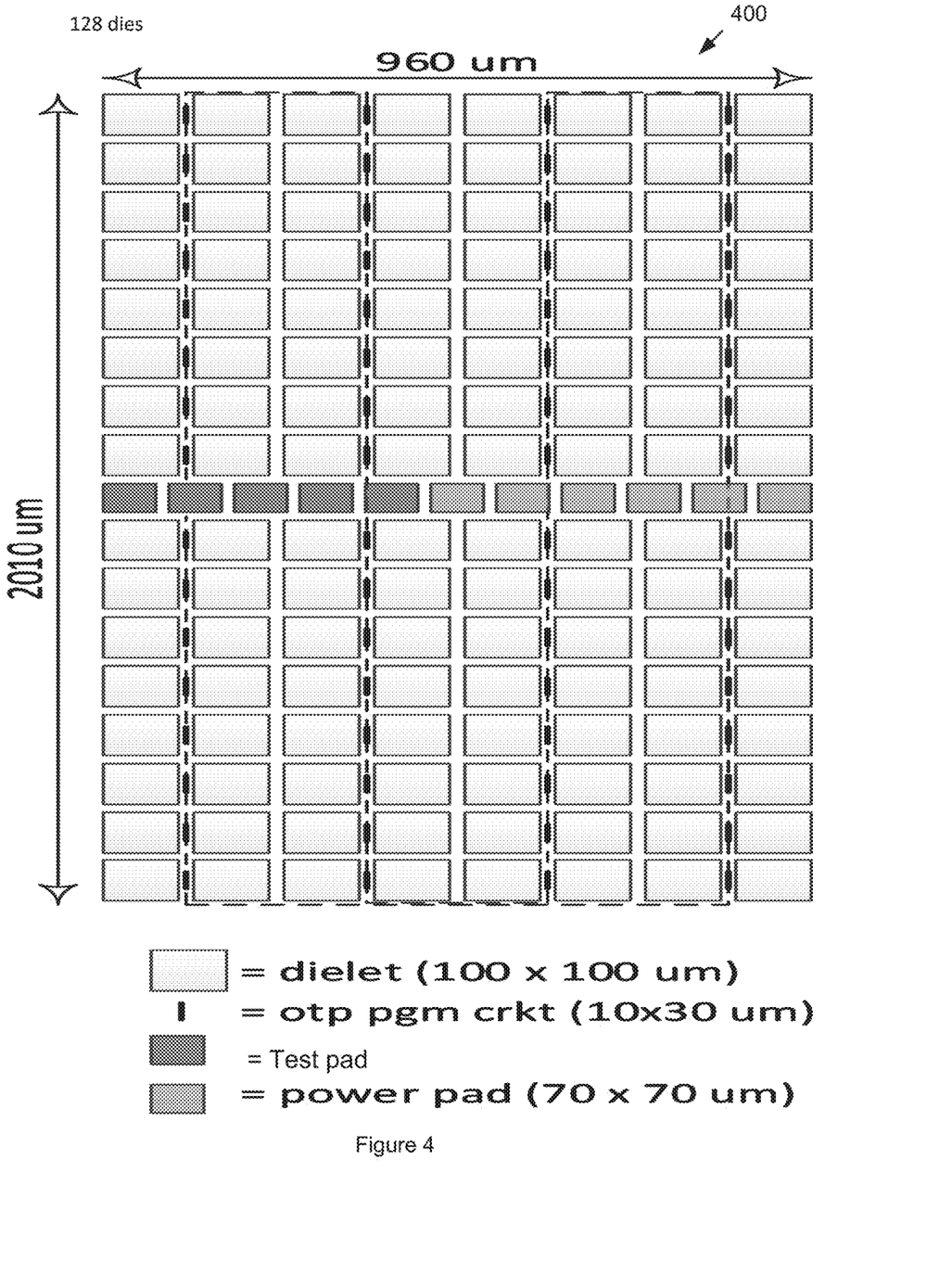
FIG. 4 illustrates an example wafer with a plurality of dies that are to be singulated with an ion etching process using an etching tool that uses an ion beam and an electrically-conductive-adhesive-composition between the wafer and the porous substrate carrying the wafer during the ion etching process.

FIG. 4 illustrates an example wafer with a plurality of dies that are to be singulated with an ion etching process using an etching tool that uses an ion beam and an electrically-conductive-adhesive-composition between the wafer and a porous substrate carrying the wafer during the ion etching process.

The wafer with the multiple dies needs to be etched and singulated. The ion etching tool is configured to etch the plurality of individual dies in the wafer as a batch by cutting them all at relatively a same time with the ion beam. The ion beam makes a very smooth cut on sidewalls forming each of the individual dies because the electrically-conductive-adhesive-composition depletes excess ions and allows a conductive path for the electrons to drain. The etching tool uses an ion beam that is configured to singulate a plurality of dies on a wafer with an ion etching process. The electrically-conductive-adhesive-composition is used to strongly adhere the die to a porous substrate that carries/supports the die during the wafer dicing/singulation.

In some production processes, the dies may need to be tested and programmed before dicing and singulation occurs. In this case, the testing and programming may occur through pads and circuitry that are on the wafer but ultimately may not be a part of the die after singulation. An example etching process such as the deep reactive ion etching (DRIE) process can be used to etch through metal to separate the dies from the rest of the wafer. Some of the metals commonly used in integrated circuit interconnects, such as but not limited to aluminum and copper, do not readily etch in the gases used in the such process. Some additional techniques may be used to assist in singulating dies using the etching process where certain metals are present.

In the disclosed technique, the metal between the dies is not completely etched away but the material surrounding the metal may be removed (through etching) such that during the pick-and-place operation following etching, as the die is lifted from the adhesive (e.g. wax) layer that is typically placed under the wafer, the metal between the dies breaks. To accomplish this, each die is designed within a "moat" around it in the wafer where only one layer of metal is applied. The locations on the wafer not associated with the moat may have as many metal layers are required. In the example of a 100 µm×100 µm die, a 5 µm wide moat may be placed all around the die. Other widths are not excluded. The metal layer in the moat may be made of copper and may be about 140 nm thick. Other materials and thickness are not excluded. With this metal layer, programming and testing may be accomplished. Thus, during the etching process, the material around the thin metal layer in the moat may be etched away. Depending on the thickness of the mask, the metal and the material around it may be completely sputtered and etched away respectively. Also, the etch directionality may be decreased to increase the undercutting of the material around the metal. At the end of this process, the material around the metal in the moat may have been completely or nearly completely removed and the metal may have been completely or partially removed due to sputtering. This results in a weak metal layer in the moat. During the pick-and-place, these weakened metal layer may be broken thus achieving singulation through this metal.

Figure 3:
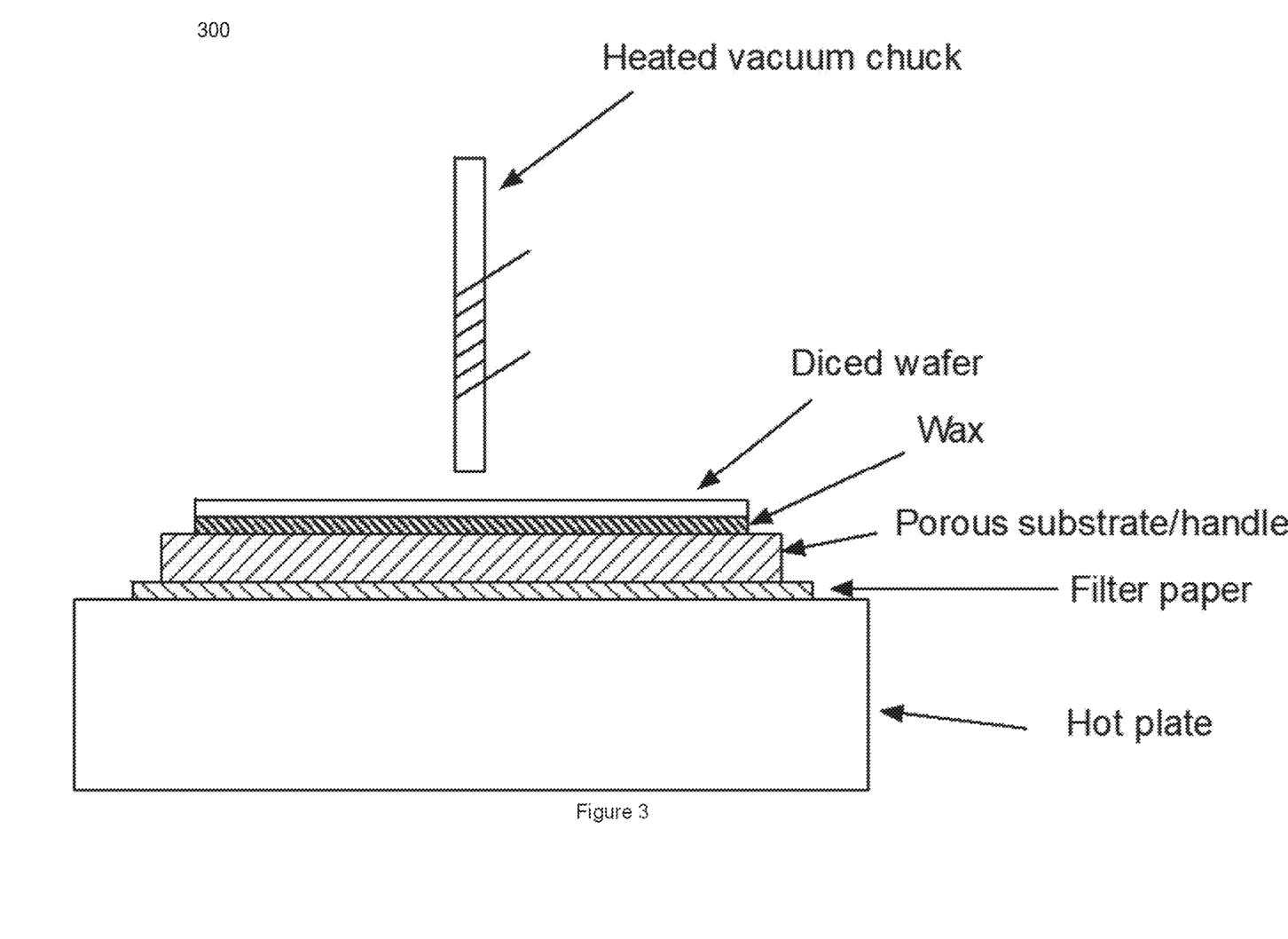
FIG. 3 is a simplified schematic diagram illustrating use of a porous substrate during production of a silicon wafer.

After the wafer has had the individual dies singulated out, then a handling process in FIG. 3 may occur.

Release from Porous Handle and Pick and Place

FIG. 3 is a simplified schematic diagram illustrating an example use of a porous substrate working with an adhesive composition during the production of a die from a wafer.

Once the wafer is diced, typically the die is released from the handle or the porous substrate that carries the die. The electrically-conductive-adhesive-composition may be used for a strong surface adhesion during the wafer dicing/singulation and a heat-induced reduced adhesion results during the pick-and-placement process. Note, other adhesives that can be melted, other than electrically-conductive-adhesive-composition, can also be used to hold the die to the substrate. For example, bee's wax by itself.

In the handling process, an extraction tool may be used to pick up and handle individual dies. In this handling process, the heat-applying-extraction-tool cooperates with a heating element such as a hot plate, a heat lamp, hot air and other methodologies. The adhesive wax, such as the wax in the electrically-conductive-adhesive-composition, holds the individual die into its expected geographical location until the heat-applying-extraction: tool transfers enough heat to the individual die to liquefy the holding wax. The heat-applying-extraction-tool, such as a heated vacuum tool or an electrostatic tool, is configured to pick up an individual die in an expected geographical position/location on the wafer. The heat-applying-extraction-tool is designed to supply an amount of heat to an etched die on the wafer that will melt the electrically-conductive-adhesive-composition holding the individual die in the expected geographical location, while the heating element supplies enough heat by itself to raise a bulk temperature of the electrically-conductive-adhesive-composition on the wafer to an elevated temperature but not hot enough to get to its melting liquid temperature. Thus, when the heat-applying-extraction-tool applies the additional heat to transfer that individual die, then any electrically-conductive-adhesive-composition will melt and become liquefied to be drained away into the evacuation component through the porous substrate.

The porous substrate has a plurality of pores that are much smaller in dimensions than the corners of the individual die itself. However, each pore is still large enough to allow liquefied wax melted by the heat-applying-extraction-tool to drain away into the evacuation component to reduce adhesion between the individual die and the porous substrate by reducing an amount of liquefied wax bridging contact between the individual die and the porous substrate during the picking up of the singulated die.

The evacuation component may be i) absorbent material, such as filter paper, that uses capillary action, ii) a low pressure vacuum cavity, iii) another similar component evacuate the liquefied wax from the die and iv) any combination of these. The evacuation component may be located underneath the porous substrate material to evacuate liquefied electrically-conductive-adhesive-composition from the individual die and through the porous substrate.

When the liquid wax is significantly removed from the die, then the die can easily be lifted and removed from the porous substrate material and then picked up and removed by the heat-applying-extraction-tool. The heat-applying-extraction: tool as stated previously may be a heated vacuum tool or electrostatic tool.

Also, the temperature is controlled so that during the handling process the temperature of the holding wax is not liquefied until the combination of the heat-applying-extraction: tool supplies it's heat to the die and then combined with the heat from the hotplate that causes a localized event of wax going past its melting point/liquefaction temperature and becomes a liquid. And then, that liquid wax drains through the porous material and is evacuated. Thus, individual dies may be handled without significantly affecting other dies from the wafer.

Note, mechanically if a system tried to pick up the small dies with some other techniques, then the small dies may mechanically break, chip, or fracture, and that causes the die to be defective.

In an embodiment, a ridged porous substrate is used as the handle. Several such substrates are available—one example is a sintered stainless steel filter. In one embodiment, this filter can have 5 μm openings/pores that form a sponge like structure. In other embodiments, the size of the openings/pores may be up to 25 μm. Generally, the openings/pores should be small enough the die will be supported (e.g., sit level) but large enough that wax will drain thru. The use of these types of surfaces is advantageous because when a wafer is placed on such surfaces only the material (called webbing) between the openings make contact to the wafer, reducing surface contact to the intended die. In the case of a 100 μm×100 μm die with this particular filter of 5 μm, less than 30% of the area of the die is in contact with the webbing. In addition, the corners of the die are far too big to fit into a 5 μm opening such that the die would be offset or not sit level on the porous substrate.

During the dicing/singulation step, due to the small size of the dies (e.g. 100 μm×100 μm), there is a likelihood that if the wafer were to only be in contact with the webbing, the dies may get dislodged, lost and/or become damaged. This likelihood is the result of weak adhesive forces due to the reduced area of contact. In order to overcome this weak adhesion to the porous substrate, the porous substrate openings are filled with wax allowing for a larger area of contact between the wafer and the porous handle. Referring to FIG. 3, the wax layer is illustrated between the wafer and the porous substrate. This layer of wax increases the adhesive force between the wafer and the handle such that the risk of the die dislodging during dicing is eliminated or reduced. The contact area may increase as an example from 30% up to a 100% of the surface area of the die. With the increased adhesion, the wafer may be diced using various processes including standard dicing processes and the dry reactive ion etching without the die dislodging or moving on the handle.

Following dicing, adhesion between the diced dies and the porous handle may be reduced in order to individually pick the dies up, without affecting neighboring dies. This may be accomplished by placing the porous handle on an absorbent material such as a filter paper. This configuration may then be placed on hot plate as illustrated in FIG. 3. As the temperature is raised to the melting point of the wax adhesive, the adhesive wax is wicked towards the hot plate and absorbed into the filter paper. With this step, the wax is removed from porous-substrate openings between the porous handle and the diced dies. The contact area between the dies and the handle may be lowered as a result. In the example described above, the contact area may become less than 30%. The porous substrate/handle allows for changing the die adhesion from a strong adhesion (for dicing step) to a reduced adhesion (for robust pick-and-place). Following this, the filter paper that has absorbed most of the wax adhesive from the porous handle may be removed. Optionally or in an alternative technique, in order to remove any additional wax, the porous handle with the diced dies or dies may be placed on another filter paper; this arrangement may then be placed onto the heated stage of a pick and place equipment. Thus, the hot plate of FIG. 3 may represent a heating surface utilized to remove the wax from the opening of the porous handle or it may represent a heated stage utilized during the pick and place operation. A heated stage may need to be added to pick and place stage if such equipment does not include such facilities. In addition to placing the wafer on the heated stage of the pick and place a vacuum chuck, optionally heated, may be used to lift the dies. The heated stage temperature may be kept slightly above the melting temperature of the wax and the temperature of the vacuum chuck may be set at the melting temperature of the wax such that an individual die may be picked up without affecting neighboring dies. As the contact area between the dies and handle may be small such as less than 30%, the surface tension is lowered enabling pick up with the vacuum chuck.

In some prior attempts during the handling process, the dies of the wafer are on thermal or UV-releasable tape, intended for reliable die-release during the production/assembly stage. For the thin and small dies mentioned in this disclosure, the use of these conventional processes (for example, thermal or UV releasable tapes) results in failures in the manufacturing process and a loss of yield. The small area of these small dies increases the unreliability of the conventional methods. Issues of adhesion forces that prevent the pick-and-place of these small dies may be encountered.

Next, the techniques herein allow smaller die sizes in the semiconductor industry. This reduces the cost per die. Equipment manufacturers prefer a design that increases the number of dies per wafer as this potentially lowers the cost per die. The sizes of the dies may vary but one example die size that is considered in this disclosure is an example 100 μm×100 μm×10 μm thick.

As die sizes decrease, conventional manufacturing techniques and processes become less appropriate. Among other process steps, the difficulty in dicing the wafer and handling the die after the wafer is diced increases. This difficulty increases the likelihood of failures during manufacturing. Thus, there is a need for manufacturing processes that are able to accommodate small die sizes.

Several approaches to accommodate small die sizes are described herein. In one approach, dry etching (ion-based etching) of small die are considered but the inventors have recognized that the use of this technique, without the modifications herein, results in inadequate smoothness of the side walls of the diced dies. As disclosed herein, a conductive wax may be utilized to direct the ion beams. In addition, the handling of the dies after dicing may be accomplished by placing the wafer on a prepared porous substrate over an absorbent material such as a filter paper. This entire configuration is then placed on a hot plate.

Many benefits may be realized using the techniques described herein. In one benefit, smaller integrated circuits may be manufactured. Smaller chips may lead to benefits such as lower costs and smaller sizes of the products that use the chips. Although standard techniques may be used to produce smaller chips, they may lead to failures in the manufacturing process and/or decreased yield.

Thus, the apparatus and methods described above may be utilized for the production of small dies for the purposes of singulation and pick and place.

Illustrative examples of the technologies disclosed herein are provided below. An embodiment of the technologies may include any one or more, and any combination of, the examples described below.

In an example 1, a silicon wafer production system is configured to operate in accordance with a method of using reactive ion etching to produce very small or thin dies, where a very small die measures in the range of about 100 µm×100 µm.

In an example 2, the method includes mounting a silicon wafer on a carrier, where the carrier comprises a electrically-conductive-adhesive-composition.

In an example 3, the electrically-conductive-adhesive-composition includes a mixture of an amount of conductive material and an amount of adhesive material.

In an example 4, the conductive material includes carbon and the adhesive material includes wax.

In an example 5, the amount of conductive material in the mixture is an amount that is greater than a percolation limit and less than an amount that causes a change to a physical property of the adhesive material of the mixture. Examples of physical properties of the adhesive material include but are not limited to melting temperature and tackiness.

In an example 6, the method includes mounting the wafer to a porous substrate by the electrically-conductive-adhesive-composition.

In an example 7, the method includes placing the porous substrate on an absorbent material. The absorbent material may comprise a filter paper.

In an example 8, the method includes applying heat to change the physical state of the electrically-conductive-adhesive-composition.

Figure 5:
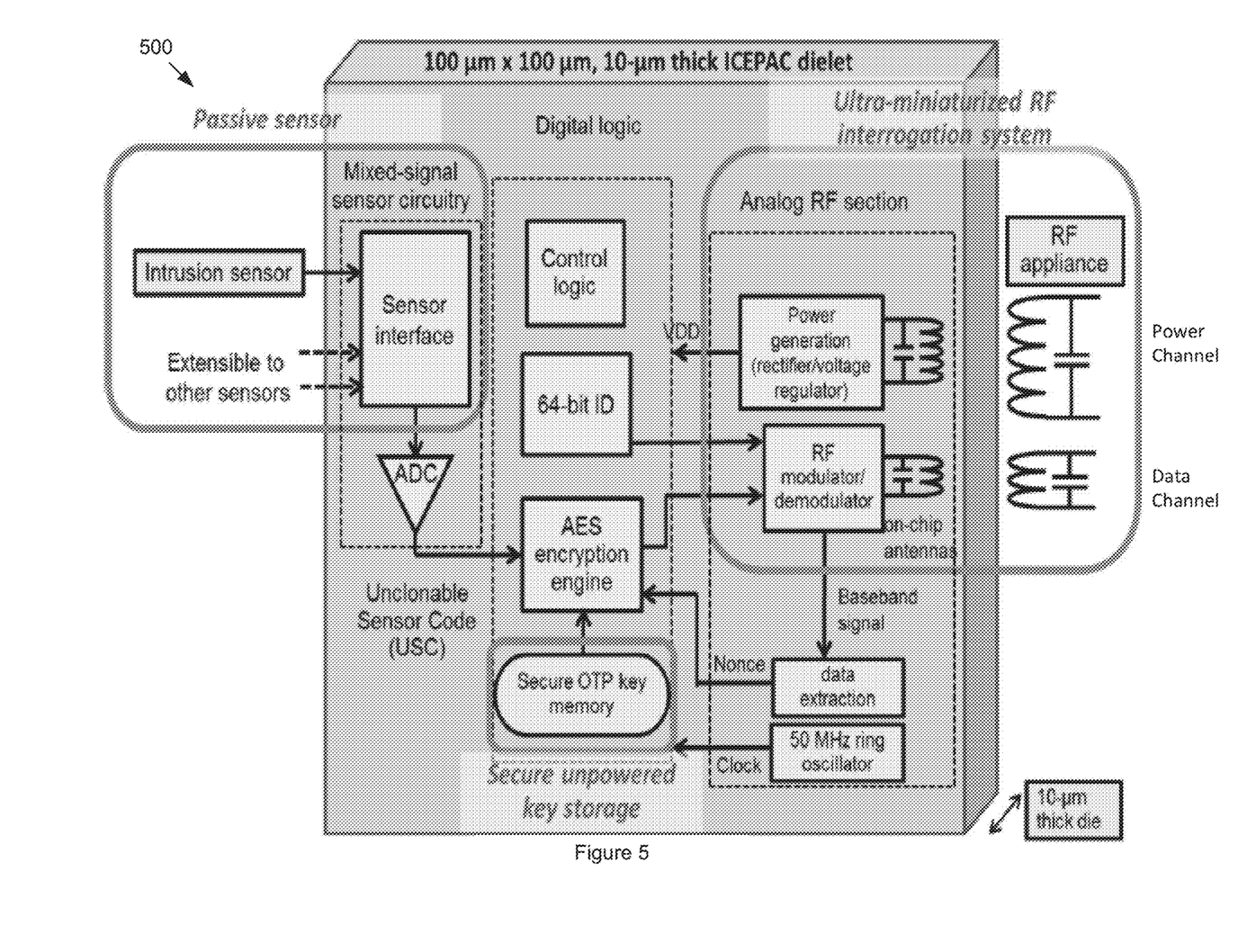
FIG. 5 illustrates a diagram of an embodiment of a configuration of an integrated circuit that contains an unclonable security ID created from the die produced by the ion etching process.

FIG. 5 illustrates a diagram of an embodiment of a configuration of an integrated circuit that contains an unclonable security ID created from the die produced by the ion etching process. The reactive ion etching process is used to produce an ultra miniature die that contains the integrated circuit.

The integrated circuit may have Radio Frequency IDentification components and circuitry used for authentication. The RFID components and circuitry include one or more coils and corresponding electrical circuits that are tuned to use two or more different resonant frequencies including 1) a first resonant RF used for power generation and 2) a second resonant RF used for data communication. The integrated circuit contains a unique signature that is used for the authentication with two or more aspects including i) a first aspect that is a programmed password in a memory embedded on the integrated circuit, and ii) a second aspect that is a unique, randomly generated code based upon a physical characteristic of the integrated circuit. The integrated circuit is contained on a die created with an ion etching process using an electrically-conductive-adhesive-composition located between a wafer and a porous substrate carrying the wafer during the ion etching process. As discussed, the electrically-conductive-adhesive-composition adheres the wafer to the porous substrate to keep the dies of the wafer in place during the ion etching process. The electrically-conductive-adhesive-composition also aids in conducting electrons away from the wafer as a drain during the ion etching process. The integrated circuit contains an embedded read-only memory. During the manufacturing of the integrated circuit, the one time programming information of security content is programed into the embedded read-only. The integrated circuit, after a singulation process from the wafer, may have no test pads or power pads geographically on the singulated integrated for probes of an external tester to connect to. The test circuitry and any such pads will be removed or eliminated after the testing of that integrated circuit occurs.

Figure 6:
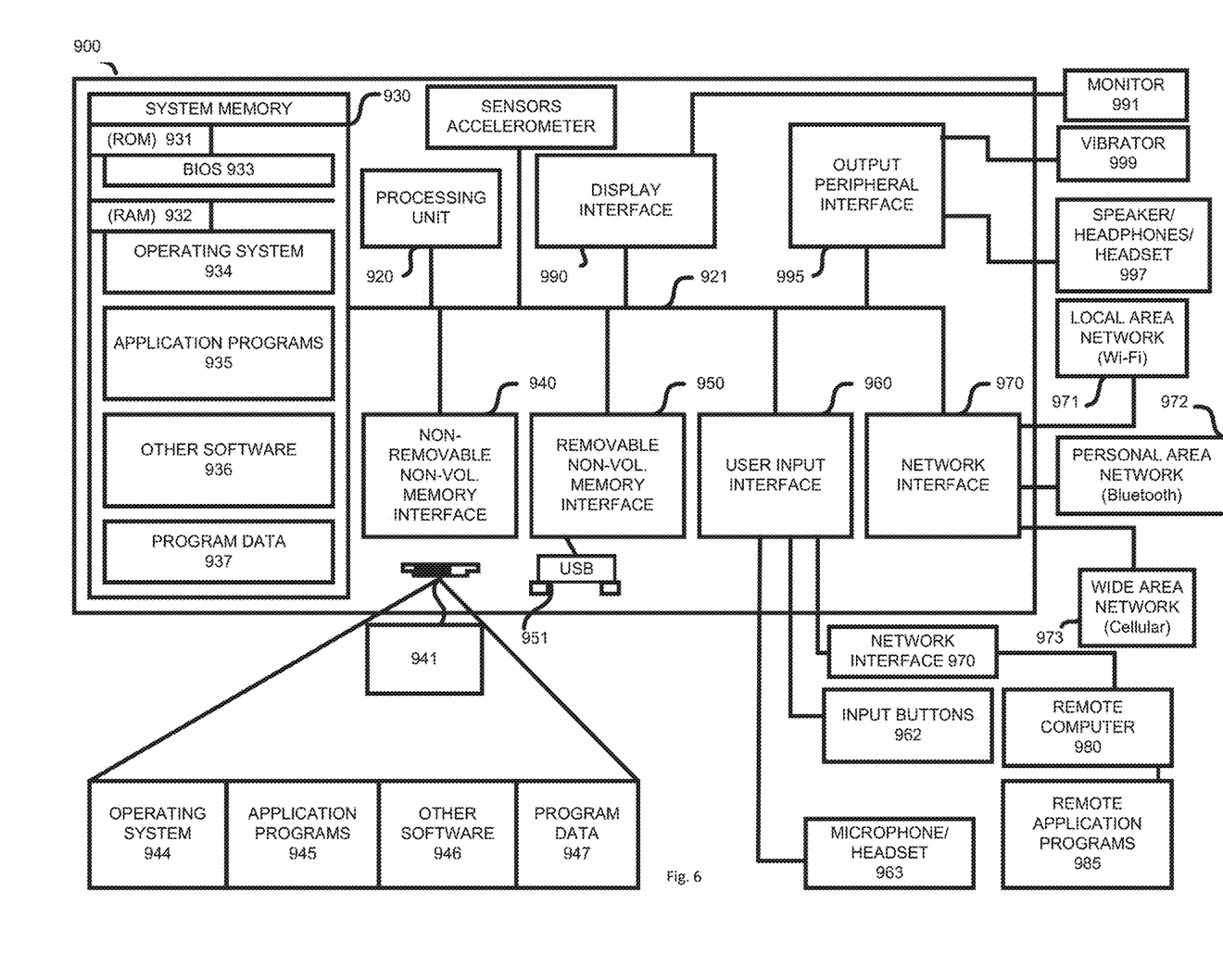
FIG. 6 illustrates an embodiment of one or more computing devices that can be a part of the systems, methods, and apparatuses associated with the integrated circuits and dies discussed herein.

FIG. 6 illustrates an embodiment of one or more computing devices 900 that can be a part of the systems, methods, and apparatuses associated with the integrated circuits and dies discussed herein. The computing device may include one or more processors or processing units 920 to execute instructions, one or more memories 930-932 to store information, one or more data input components 960-963 to receive data input from a user of the computing device 900, one or more modules that include the management module, a network interface communication circuit 970 to establish a communication link to communicate with other computing devices external to the computing device, one or more sensors where an output from the sensors is used for sensing a specific triggering condition and then correspondingly generating one or more preprogrammed actions, a display screen 991 to display at least some of the information stored in the one or more memories 930-932 and other components. Note, portions of this system that are implemented in software 944, 945, 946 may be stored in the one or more memories 930-932 and are executed by the one or more processors 920.

The system memory 930 includes computer storage media in the form of volatile and/or nonvolatile memory such as read-only memory (ROM) 931 and random access memory (RAM) 932. These computing machine-readable media can be any available media that can be accessed by computing system 900. By way of example, and not limitation, computing machine-readable media use includes storage of information, such as computer-readable instructions, data structures, other executable software, or other data. Computer-storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other tangible medium which can be used to store the desired information and which can be accessed by the computing device 900. Transitory media such as wireless channels are not included in the machine-readable media. Communication media typically embody computer readable instructions, data structures, other executable software, or other transport mechanism and includes any information delivery media.

The system further includes a basic input/output system 933 (BIOS) containing the basic routines that help to transfer information between elements within the computing system 900, such as during start-up, is typically stored in ROM 931. RAM 932 typically contains data and/or software that are immediately accessible to and/or presently being operated on by the processing unit 920. By way of example, and not limitation, the RAM 932 can include a portion of the operating system 934, application programs 935, other executable software 936, and program data 937.

The computing system 900 can also include other removable/non-removable volatile/nonvolatile computer storage media. By way of example only, the system has a solid-state memory 941. The solid-state memory 941 is typically connected to the system bus 921 through a non-removable memory interface such as interface 940, and USB drive 951 is typically connected to the system bus 921 by a removable memory interface, such as interface 950.

A user may enter commands and information into the computing system 900 through input devices such as a keyboard, touchscreen, or software or hardware input buttons 962, a microphone 963, a pointing device and/or scrolling input component, such as a mouse, trackball or touch pad. These and other input devices are often connected to the processing unit 920 through a user input interface 960 that is coupled to the system bus 921, but can be connected by other interface and bus structures, such as a parallel port, game port, or a universal serial bus (USB). A display monitor 991 or other type of display screen device is also connected to the system bus 921 via an interface, such as a display interface 990. In addition to the monitor 991, computing devices may also include other peripheral output devices such as speakers 997, a vibrator 999, and other output devices, which may be connected through an output peripheral interface 995.

The computing system 900 can operate in a networked environment using logical connections to one or more remote computers/client devices, such as a remote computing system 980. The remote computing system 980 can a personal computer, a mobile computing device, a server, a router, a network PC, a peer device or other common network node, and typically includes many or all of the elements described above relative to the computing system 900. The logical connections can include a personal area network (PAN) 972 (e.g., Bluetooth®), a local area network (LAN) 971 (e.g., Wi-Fi), and a wide area network (WAN) 973 (e.g., cellular network), but may also include other networks such as a personal area network (e.g., Bluetooth®). Such networking environments are commonplace in offices, enterprise-wide computer networks, intranets and the Internet. A browser application may be resonant on the computing device and stored in the memory.

When used in a LAN networking environment, the computing system 900 is connected to the LAN 971 through a network interface 970, which can be, for example, a Bluetooth® or Wi-Fi adapter. When used in a WAN networking environment (e.g., Internet), the computing system 900 typically includes some means for establishing communications over the WAN 973. With respect to mobile telecommunication technologies, for example, a radio interface, which can be internal or external, can be connected to the system bus 921 via the network interface 970, or other appropriate mechanism. In a networked environment, other software depicted relative to the computing system 900, or portions thereof, may be stored in the remote memory storage device. By way of example, and not limitation, the system has remote application programs 985 as residing on remote computing device 980. It will be appreciated that the network connections shown are examples and other means of establishing a communications link between the computing devices that may be used.

As discussed, the computing system 900 can include mobile devices with a processing unit 920, a memory (e.g., ROM 931, RAM 932, etc.), a built-in battery to power the computing device, an AC power input to charge the battery, a display screen, a built-in Wi-Fi circuitry to wirelessly communicate with a remote computing device connected to network.

It should be noted that the present design can be carried out on a computing system such as that described with respect to shown herein. However, the present design can be carried out on a server, a computing device devoted to message handling, or on a distributed system in which different portions of the present design are carried out on different parts of the distributed computing system.

In some embodiments, software used to facilitate algorithms discussed herein can be embedded onto a non-transitory machine-readable medium. A machine-readable medium includes any mechanism that stores information in a form readable by a machine (e.g., a computer). For example, a non-transitory machine-readable medium can include read-only memory (ROM); random access memory (RAM); magnetic disk storage media; optical storage media; flash memory devices; Digital Versatile Disc (DVD's), EPROMs, EEPROMs, FLASH memory, magnetic or optical cards, or any type of media suitable for storing electronic instructions.

Note, an application described herein includes but is not limited to software applications, mobile applications, and programs that are part of an operating system application. Some portions of this description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. These algorithms can be written in a number of different software programming languages such as C, C+, HTTP, Java, or other similar languages. Also, an algorithm can be implemented with lines of code in software, configured logic gates in software, or a combination of both. In an embodiment, the logic consists of electronic circuits that follow the rules of Boolean Logic, software that contain patterns of instructions, or any combination of both. Any portions of an algorithm implemented in software can be stored in an executable format in portion of a memory and is executed by one or more processors.

It should be borne in mind, however, that all of these and similar terms are to be associated with the appropriate physical quantities and are merely convenient labels applied to these quantities. Unless specifically stated otherwise as apparent from the above discussions, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers, or other such information storage, transmission or display devices.

Many functions performed by electronic hardware components can be duplicated by software emulation. Thus, a software program written to accomplish those same functions can emulate the functionality of the hardware components in input-output circuitry. Thus, provided herein are one or more non-transitory machine-readable medium configured to store instructions and data that when executed by one or more processors on the computing device of the foregoing system, causes the computing device to perform the operations outlined as described herein.

References in the specification to "an embodiment," "an example", etc., indicate that the embodiment or example described may include a particular feature, structure, or characteristic, but every embodiment may not necessarily include the particular feature, structure, or characteristic.

Such phrases can be not necessarily referring to the same embodiment. Further, when a particular feature, structure, or characteristic is described in connection with an embodiment, it is believed to be within the knowledge of one skilled in the art to affect such feature, structure, or characteristic in connection with other embodiments whether or not explicitly indicated.

While the foregoing design and embodiments thereof have been provided in considerable detail, it is not the intention of the applicant(s) for the design and embodiments provided herein to be limiting. Additional adaptations and/or modifications are possible, and, in broader aspects, these adaptations and/or modifications are also encompassed. Accordingly, departures may be made from the foregoing design and embodiments without departing from the scope afforded by the following claims, which scope is only limited by the claims when appropriately construed.

The invention claimed is:

1. A method of manufacturing a die, comprising:
   singulating a plurality of dies on a wafer with an ion etching process using an etching tool that uses an ion beam;
   using an electrically-conductive-adhesive-composition between the wafer and a porous substrate carrying the wafer during the ion etching process, where the electrically-conductive-adhesive-composition adheres the wafer to the porous substrate to keep the dies in place during the ion etching process, where the electrically-conductive-adhesive-composition also aids in at least one of conducting electrons away from the wafer as a drain or conducting electrons into the wafer as a source of electrons during the ion etching process; and
   after the etching process, then during a handling process of the manufacturing process, a heat-applying-extraction-tool applies heat to melt the electrically-conductive-adhesive-composition through the porous substrate to an evacuation component in order to then pick up an individual die singulated from the wafer.

2. The method of claim 1, where the electrically-conductive-adhesive-composition is a composition of wax loaded with electrically conductive material.

3. The method of claim 2, where the electrically conductive material is selected from a group consisting of i) carbon particles, ii) silver particles, iii) copper particles, iv) gold particles, or iv) a combination of these two or three, loaded within the wax.

4. The method of claim 2, where the porous substrate has a plurality of pores that are smaller in dimensions of the individual die itself but still large enough to allow liquefied wax, melted by the heat-applying-extraction-tool, to drain away into the evacuation component to reduce adhesion between the individual die and the porous substrate, wherein draining away the liquefied wax reduces an amount of liquefied wax bridging contact between the individual die and the porous substrate during the picking up of the singulated die.

5. The method of claim 1, where the evacuation component is selected from a group consisting of i) absorbent material that uses capillary action, ii) a low pressure vacuum cavity, and iii) any combination of both, where the evacuation component is underneath the porous substrate to evacuate liquefied electrically-conductive-adhesive-composition from the individual die and through the porous substrate.

6. The method of claim 1, where the heat-applying-extraction-tool cooperates with a heating element, where the heat-applying-extraction-tool is a heated vacuum tool or an electrostatic tool, configured to pick up an individual die in an expected geographical location on the wafer, where the heat-applying-extraction-tool is designed to supply an amount of heat to an etched die on the wafer that will melt the electrically-conductive-adhesive-composition holding the individual die in the expected geographical location, while the heating element supplies enough heat by itself to raise a bulk temperature of the electrically-conductive-adhesive-composition on the wafer to an elevated temperature but not hot enough to get to its melting liquid temperature; and thus, when the heat-applying-extraction-tool applies the additional heat to the individual die, then any electrically-conductive-adhesive-composition will melt and become liquefied to be drained away into the evacuation component through the porous substrate.

7. The method of claim 1, where the ion etching tool is configured to etch the plurality of individual dies in the wafer as a batch by cutting them all at relatively a same time with the ion beam, where the ion beam makes a smooth cut on sidewalls forming each of the individual dies to allow a conductive path for the electrons to drain.

8. The method of claim 1, where the electrically-conductive-adhesive-composition is a composition of wax loaded with carbon particles, the heat-applying-extraction-tool is a heated vacuum tool or an electrostatic tool, and the evacuation component is filter paper that uses capillary action to remove liquefied wax from porous-substrate openings between the porous substrate and the etched individual die.

9. The method of claim 1, where the electrically-conductive-adhesive-composition includes a mixture of an amount of conductive material and an amount of adhesive material, where the amount of conductive material in the mixture is an amount that is greater than a percolation limit and less than an amount that causes the electrically-conductive-adhesive composition to become too viscous to release the die.

10. An integrated circuit created from the die produced by the process of claim 1.

11. A system to manufacture a plurality of dies, comprising:
    an etching tool that uses an ion beam that is configured to singulate a plurality of dies on a wafer with an ion etching process;
    an electrically-conductive-adhesive-composition that is located between the wafer and a porous substrate carrying the wafer during the ion etching process, where the electrically-conductive-adhesive-composition adheres the wafer to the porous substrate to keep the dies in place during the ion etching process, where the electrically-conductive-adhesive-composition also aids in at least one of conducting electrons away from the wafer as a drain or conducting electrons into the wafer as a source of electrons during the ion etching process; and
    a heat-applying-extraction-tool configured to apply heat to an individual die during a handling process of the manufacturing process, which is after the etching process, where the heat-applying-extraction-tool is configured to apply heat to melt an adhesive material through the porous substrate to an evacuation component in order to then pick up an individual die singulated from the wafer.

12. The system of claim 11, where the electrically-conductive-adhesive-composition is a composition of wax loaded with electrically conductive material.

13. The system of claim 12, where the electrically conductive material is selected from a group consisting of i)

carbon particles, ii) silver particles, iii) copper particles, iv) gold particles, or iv) a combination of these two or three, loaded within the wax, and where the electrically-conductive-adhesive-composition is the adhesive material.

14. The system of claim 12, where the electrically-conductive-adhesive-composition is the adhesive material, and where the porous substrate has a plurality of pores that are smaller in dimensions than the individual die itself but still large enough to allow liquefied wax, melted by the heat-applying-extraction-tool, to drain away into the evacuation component to reduce adhesion between the individual die and the porous substrate, wherein draining away the liquefied wax reduces an amount of liquefied wax bridging contact between the individual die and the porous substrate during the picking up of the singulated die.

15. The system of claim 11, where the evacuation component is selected from a group consisting of i) absorbent material that uses capillary action, ii) a low pressure vacuum cavity, and iii) any combination of both, where the evacuation component is underneath the porous substrate to evacuate liquefied adhesive material from the individual die and through the porous substrate.

16. The system of claim 11, where the heat-applying-extraction-tool cooperates with a heating element, where the heat-applying-extraction-tool is a heated vacuum tool or an electrostatic tool, configured to pick up an individual die in an expected geographical location on the wafer, where the heat-applying-extraction-tool is designed to supply an amount of heat to an etched die on the wafer that will melt the electrically-conductive-adhesive-composition holding the individual die in the expected geographical location, while the heating element supplies enough heat by itself to raise a bulk temperature of the electrically-conductive-adhesive-composition on the wafer to an elevated temperature but not hot enough to get to its melting liquid temperature; and thus, when the heat-applying-extraction-tool applies the additional heat to the individual die, then any electrically-conductive-adhesive-composition will melt and become liquefied to be drained away into the evacuation component through the porous substrate.

17. The system of claim 11, where the ion etching tool is configured to etch the plurality of individual dies in the wafer as a batch by cutting them all at relatively a same time with the ion beam, where the ion beam makes a smooth cut on sidewalls forming each of the individual dies to allow a conductive path for the electrons to drain.

18. The system of claim 11, where the electrically-conductive-adhesive-composition is a composition of wax loaded with carbon particles, the heat-applying-extraction-tool is a heated vacuum tool or an electrostatic tool, and the evacuation component is filter paper that uses capillary action to remove liquefied wax from porous-substrate openings between the porous substrate and the etched individual die.

19. The system of claim 11, where the electrically-conductive-adhesive-composition includes a mixture of an amount of conductive material and an amount of adhesive material, where the amount of conductive material in the mixture is an amount that is greater than a percolation limit and less than an amount that causes the electrically-conductive-adhesive composition to become too viscous to release the die.

20. An apparatus, comprising:

an integrated circuit having Radio Frequency IDentification components and circuitry used for authentication, where the RFID components and circuitry are tuned to use two or more different resonant frequencies including 1) a first resonant RF used for power generation and 2) a second resonant RF used for data communication, where the integrated circuit contains a unique signature that is used for the authentication with two or more aspects including i) a first aspect that is a programmed password in a memory embedded on the integrated circuit, and ii) a second aspect that is a unique, randomly generated code based upon a physical characteristic of the integrated circuit, where the integrated circuit is contained on a die created with an ion etching process using an electrically-conductive-adhesive-composition located between a wafer and a porous substrate carrying the wafer during the ion etching process, where the electrically-conductive-adhesive-composition adheres the wafer to the porous substrate to keep the dies of the wafer in place during the ion etching process, where the electrically-conductive-adhesive-composition aids also aids in at least one of conducting electrons away from the wafer as a drain or conducting electrons into the wafer as a source of electrons during the ion etching process.

* * * * *